United States Patent
Komatsu et al.

(10) Patent No.: US 7,800,878 B2
(45) Date of Patent: Sep. 21, 2010

(54) POWER SUPPLY CONTROL CIRCUIT, AND ELECTRONIC CONTROL DEVICE, POWER SUPPLYING CIRCUIT, AND POWER CONTROL INTEGRATED CIRCUIT EQUIPPED WITH POWER SUPPLY CONTROL CIRCUIT

(75) Inventors: Kazuhiro Komatsu, Kobe (JP); Yuichiro Shimizu, Kobe (JP); Daisuke Enomoto, Kobe (JP)

(73) Assignee: Fujitsu Ten Limited, Kobe (JP)

( * ) Notice: Subject to any disclaimer, the term of this patent is extended or adjusted under 35 U.S.C. 154(b) by 630 days.

(21) Appl. No.: 11/802,216

(22) Filed: May 21, 2007

(65) Prior Publication Data
US 2007/0268048 A1 Nov. 22, 2007

(30) Foreign Application Priority Data
May 22, 2006 (JP) ............................. 2006-141653

(51) Int. Cl.
H02H 3/08 (2006.01)
H02H 3/00 (2006.01)
(52) U.S. Cl. ........................................ 361/93.1; 361/84
(58) Field of Classification Search .................. 361/84, 361/93.1
See application file for complete search history.

(56) References Cited

U.S. PATENT DOCUMENTS 5,539,610 A * 7/1996 Williams et al. ............ 361/246
5,642,251 A 6/1997 Lebbolo et al.
5,764,465 A 6/1998 Mattes et al.
6,127,745 A 10/2000 Bolz
6,154,081 A * 11/2000 Pakkala et al. ............. 327/309
6,650,520 B2 * 11/2003 He .............................. 361/84
6,781,502 B1 * 8/2004 Robb ........................ 337/167
6,791,207 B2 * 9/2004 Yoshida et al. ............ 307/10.1

FOREIGN PATENT DOCUMENTS

| EP | 1 357 658 A1 | 10/2003 |
| JP | A 05-259864 | 8/1993 |
| JP | A-08-223935 | 8/1996 |
| JP | A 2000-138574 | 5/2000 |
| JP | A 2003-037933 | 2/2003 |

OTHER PUBLICATIONS

Dana Davis, "Overload and Reverse-Current Circuitry Protects Battery and Load" EDN Electrical Design News, Reed Business Information, Highland Ranch, CO, US, vol. 41, No. 5, Mar. 1, 1996.

* cited by examiner

Primary Examiner—Robert DeBeradinis
Assistant Examiner—Scott Bauer
(74) Attorney, Agent, or Firm—Oliff & Berridge, PLC

(57) ABSTRACT

A power supply control circuit is configured including a MOS-FET 61 connected between a DC power supply 10 and a load circuit 31 so that a body diode D300 formed between the drain and the source is in a forward direction; and a holding circuit 62 for maintaining the ON state of the MOS-FET 61 for a predetermined time when the power supply from the DC power supply 10 is stopped; where heat generation of the switching element by the surge voltage is suppressed when the surge voltage is generated to prevent breakdown of the switching element while preventing breakdown of internal circuits with respect to reverse connection of the power supply.

19 Claims, 13 Drawing Sheets

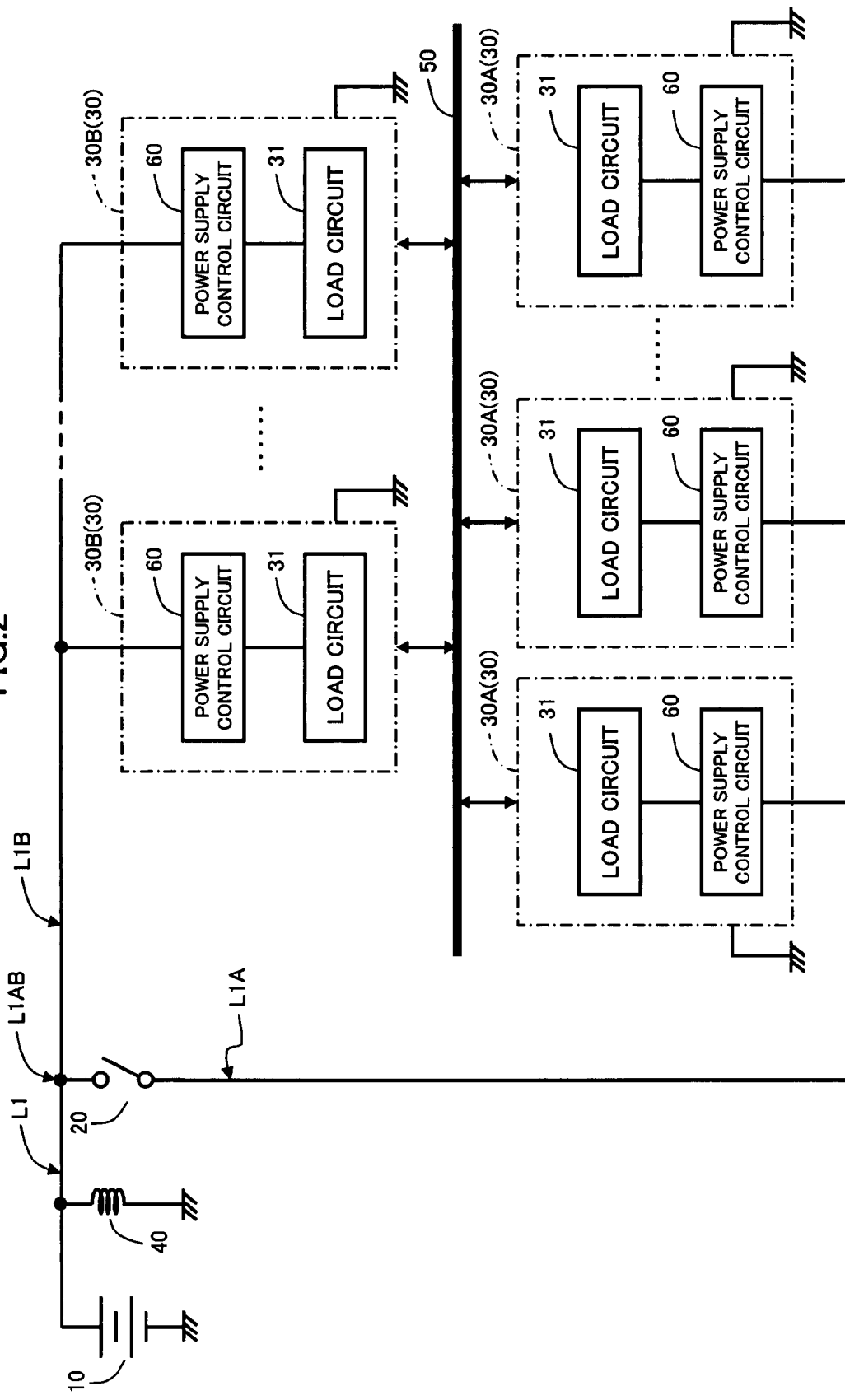

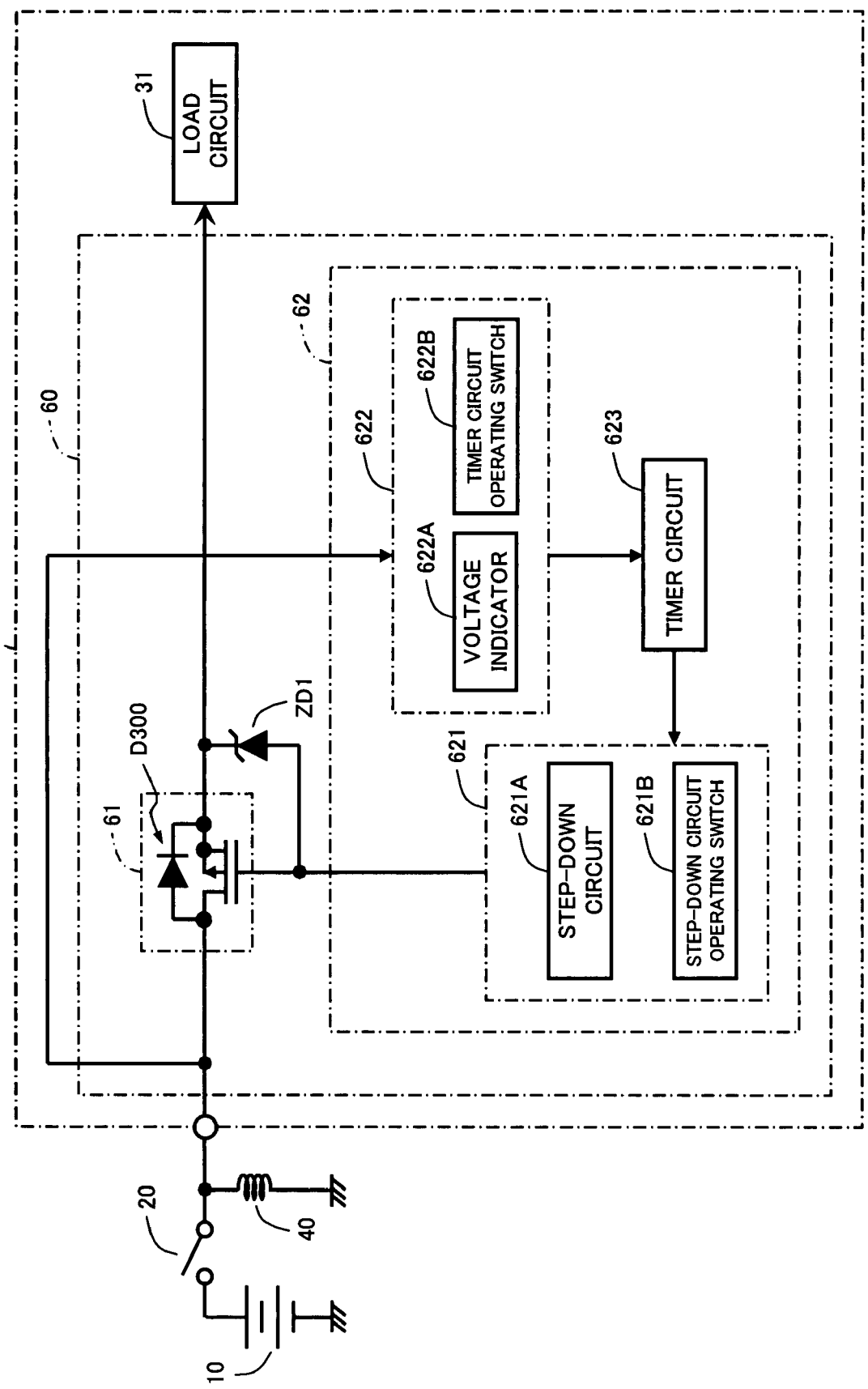

POWER SUPPLY CONTROL CIRCUIT, AND ELECTRONIC CONTROL DEVICE, POWER SUPPLYING CIRCUIT, AND POWER CONTROL INTEGRATED CIRCUIT EQUIPPED WITH POWER SUPPLY CONTROL CIRCUIT

BACKGROUND OF THE INVENTION

1. Field of the Invention

The present invention relates to a power supply control circuit including a MOS-FET connected between a DC power supply and a load circuit and connected so that a body diode formed between the drain and the source is in the forward direction, and a holding circuit for maintaining the ON state of the MOS-FET for a predetermined time when the power supply from the DC power supply is stopped; and an electronic control device, a power supplying circuit, and a power supply control integrated circuit equipped with the power supply control circuit.

2. Description of the Related Art

When the polarity of the DC power supply such as battery is reverse connected by mistake in supplying power to electronic equipment such as an electronic control device mounted on the vehicle, the elements arranged in the electronic equipment may be damaged and the electronic equipment may breakdown. A protective circuit has been conventionally arranged to prevent such breakdown.

As shown in FIG. 1A, for example, a diode D100 is connected in series between a DC power supply 10 and a load circuit 31, which is the internal circuit of the electronic control device 30, so as to be forward biased, whereby the breakdown of the element of the load circuit 31 is avoided by shielding the reverse flow of the current by the diode D100 that becomes reverse biased when the polarity of the DC power supply 10 is reverse connected by mistake.

Furthermore, as shown in FIG. 1B, a current fuse 11 is connected in series between the DC power supply 10 and the load circuit 31, which is the internal circuit of the electronic control device 30, and a diode D200 is connected between the current fuse 11 and the load circuit 31 so as to be reverse biased, that is, so that the anode of the diode D200 is grounded, whereby the breakdown of the element of the load circuit 31 is avoided with a configuration in which the current fuse 11 is fused by the over current flowing in through the diode D200 that becomes forward biased when the polarity of the DC power supply 10 is reverse connected by mistake.

However, if the configuration shown in FIG. 1A is applied to the vehicle, the operating voltage to be supplied to the electronic control device 30 slightly lowers due to the voltage drop at the diode connected in series, and thus the start-up performance of the vehicle degrades such as when the capacity of the battery mounted on the vehicle lowers, and furthermore, the electronic control device 30 over heats by the heat generation of the diode when the diode is incorporated in the electronic control device 30 or when mounted close to the electronic control device 30.

In the configuration shown in FIG. 1B, the electronic control device 30 will not be supplied with power until replaced with a new current fuse 11 even if the connection to the DC power supply 10 is returned to the normal polarity after the current fuse 11 is fused by over current, and thus the function of the electronic control device 30 remains lost, but a usual driver cannot easily perform the task of replacing the current fuse 11. Furthermore, an absolute guarantee that the electronic control device 30 will not breakdown with respect to the current value and the time until the current fuse 11 is fused is difficult to make, and the electronic control device 30 may breakdown before the current fuse 11 is fused depending on the state of the power supply voltage or the impedance of the electronic control device 30.

In order to resolve such problems, a configuration is adopted in which a p-channel enhancement type MOS-FET 61 is connected as a switching element between the DC power supply 10 and the load circuit 31, which is the internal circuit of the electronic control device 30 so that the body diode D300 is in the forward direction, a Zener diode ZD1 is connected between the gate and the source of the MOS-FET 61 so that the anode is positioned at the gate, and the gate of the MOS-FET 61 is grounded by way of a resistor R1, as shown in FIG. 1C.

In this case, the MOS-FET 61 is turned ON and the load circuit 31 is supplied with power if the polarity of the DC power supply 10 is properly connected, but the MOS-FET 61 is turned OFF and the reverse flow of the current is shielded if the polarity of the DC power supply 10 is reverse connected, thereby avoiding the breakdown of the element of the load circuit 31.

However, even with the configuration shown in FIG. 1C, if a negative surge voltage that attempts to flow large current to the power supply line is generated when the MOS-FET 61 is in the OFF state, the possibility of the MOS-FET 61 being damaged is high since the withstanding voltage of the reverse voltage of the body diode D300 of the MOS-FET 61 is low compared to a commonly used stand-alone diode.

Thus, a power supply device arranged with a switching element that protects the internal circuit when the polarity of the DC power supply is reverse connected by mistake, and capable of handling the breakage of the MOS-FET 61 when the negative surge voltage is generated is proposed in Japanese Laid-Open Patent Publication No. 8-223935.

Such power supply device is configured with a switching element including an enhancement type MOS-FET connected between the DC power supply and the main circuit so that the body diode between the drain and the source is in the forward direction, and an active clamp circuit serving as a switching element protecting circuit configured by a Zener diode and a diode connected between the gate and the drain of the switching element, where the switching element is turned OFF to protect the main circuit when the polarity of the DC power supply is reverse connected by mistake, and the switching element is forcibly turned ON by the active clamp circuit when the negative surge voltage is applied.

However, the following problems arise even if the active clamp circuit described above is used.

The active clamp circuit is a circuit that allows the load energy, which is generated when the negative surge voltage is applied, to escape with the heat loss of the MOS-FET by using the MOS-FET in an unsaturated region, and intentionally creates a potential difference between the drain and the source of the MOS-FET to allow the load energy to escape with the loss energy caused by the potential difference.

The potential difference is determined by the reverse voltage of the Zener diode configuring the active clamp circuit, but the reverse bias voltage is usually set large since the load energy can be escaped at an earlier stage with larger potential difference.

Therefore, if the negative surge voltage is applied when using the power supply device, a large potential difference determined by the reverse bias voltage of the Zener diode configuring the active clamp circuit is created between the drain and the source of the MOS-FET, and thus the power consumption of the MOS-FET becomes large, that is, the heat generation becomes large due to the potential difference.

Heat generation becomes larger since the MOS-FET is in the unsaturated state and is not completely in the ON state.

One factor that further adds to the problem of heat generation is field decay surge. The field decay surge is a negative surge energy that is generated according to the inductive load when the current is shielded from the state in which large current is flowing to the inductive load, and is known to be a very large voltage among the surge voltages generated in the vehicle. Since a great number of inductive loads of motor, solenoid coil, and the like that drives each part of the vehicle such as electrically operated power steering and wipers are arranged in the vehicle, the generation of the field decay surge is inevitable when the switch with respect to the inductive load that is being supplied with power from the power supply device is turned OFF.

That is, the field decay surge is generated when the switch with respect to the inductive load in an electrically conducting state is turned OFF, whereby the frequency of occurrence becomes higher than other surge voltages such as surge voltage resulting from ESD (Electrostatic discharge) and surge voltage flowing from other power supply systems, which adds to the problem of heat generation. In consequence, the efficiency may lower due to heat loss of the power supplied from the power supply device and failure of the power supply device may arise.

SUMMARY OF THE INVENTION

In view of the problems of the prior art, the present invention aims to provide a power supply control circuit capable of preventing breakdown of internal circuits even when the polarity of the power supply device is mistakenly connected, and suppressing heat generation of the switching element due to negative surge voltage to prevent breakdown of the switching element; and an electronic control device, a power supplying circuit, and a power supply control integrated circuit equipped with the power supply control circuit.

In order to achieve the above aim, the DC power supply according to the present invention includes a MOS-FET connected between a DC power supply and a load circuit so that a body diode formed between the drain and the source is in forward direction; and a holding circuit for maintaining the ON state of the MOS-FET for a predetermined time when the power supply from the DC power supply is stopped.

Furthermore, the DC power supply device preferably includes a forcing-OFF circuit for turning OFF the MOS-FET irrespective of the operation of the holding circuit based on the drain-source voltage or current of the MOS-FET.

Other inventions should become apparent by referencing the following examples.

BRIEF DESCRIPTION OF THE DRAWINGS

FIG. 2 is a functional block configuration diagram in which a power supply control circuit is applied to a vehicle serving as a system in which a plurality of electronic control devices cooperate to perform a control;

FIG. 3 is a circuit block configuration diagram of the power supply control circuit including a holding circuit;

DESCRIPTION OF THE PREFERRED EMBODIMENTS

Figure 1A:
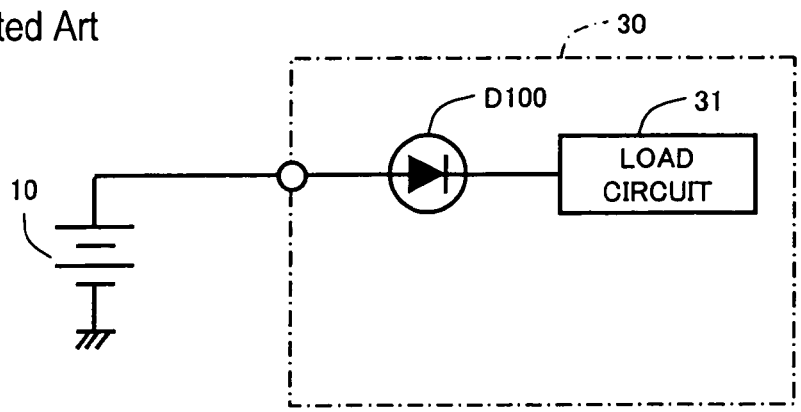
FIG. 1A is a circuit block configuration diagram of a conventional power supply control circuit in which a diode is inserted between a DC power supply and a load circuit.
Figure 1B:
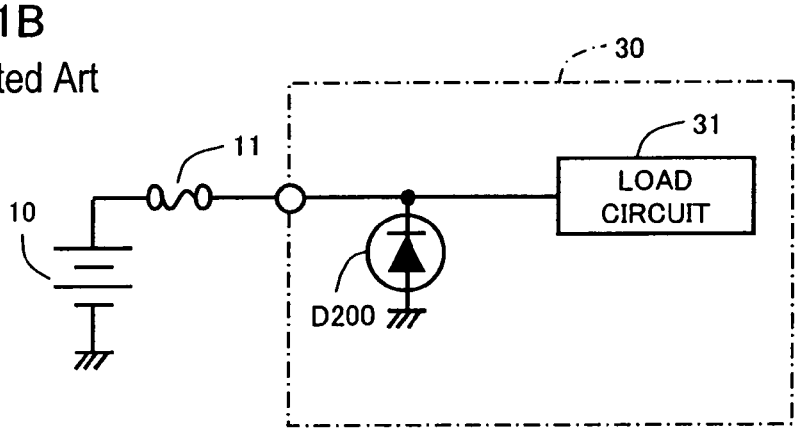
FIG. 1B is a circuit block configuration diagram of a conventional power supply control circuit in which a fuse is inserted between the DC power supply and the load circuit.
Figure 1C:
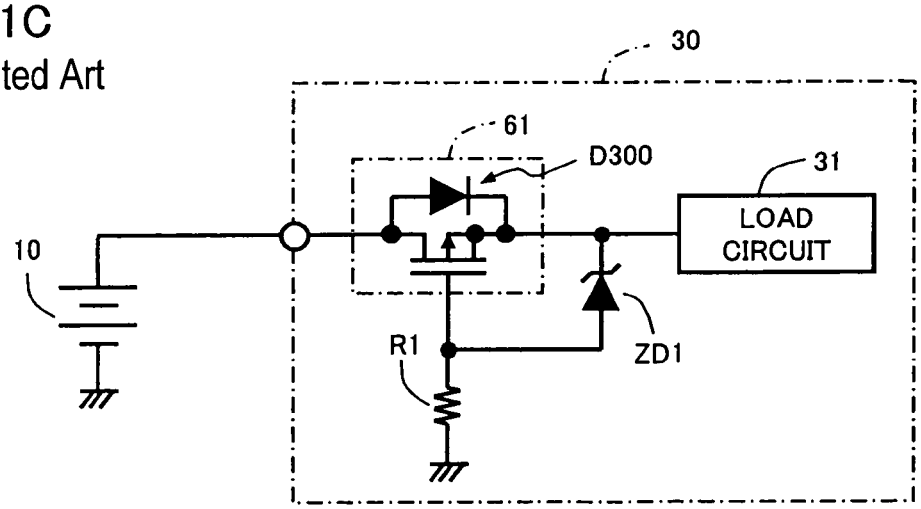
FIG. 1C is a circuit block configuration diagram of a conventional power supply control circuit in which a MOS-FET is inserted between the DC power supply and the load circuit.

A case in which the power supply control circuit according to the present invention is applied to an electronic control system of the vehicle in which a plurality of electronic control devices cooperate to perform a control will be described below.

The electronic control system of the vehicle is a system in which a plurality of electronic control devices 30 including an electronic control unit (hereinafter also referred to as "ECU") cooperate to control the vehicle, as shown in FIG. 2.

The electronic control system is configured including a DC power supply 10 such as battery for supplying power to each electronic control device 30, an ignition switch 20, a plurality of IG ON control devices 30A that are supplied with power and operate only when the ignition switch 20 is turned ON, a plurality of always-ON control devices 30B that are always supplied with power and operate irrespective of the opening/closing state of the ignition switch 20, and various motors and a plurality of other inductive loads 40 mounted on the vehicle for electronically operated power steering, wiper, and the like drive controlled by the electronic control device 30, where the IG ON control devices 30A and the always-ON control devices 30B are network connected with respect to each other by way of a data communication bus 50 such as CAN (Controller Area Network).

The IG ON control device 30A includes the plurality of electronic control devices 30 for controlling function blocks such as engine and automatic transmission, and the always-ON control device 30B includes a plurality of electronic control devices 30 for performing security management such as door lock control and antitheft control.

As shown in FIG. 2, the each electronic control device 30 includes a load circuit 31, which is an electronic control block configured by CPU and peripheral circuits, and a power supply control circuit 60 connected between the DC power supply 10 and the load circuit 31.

Various embodiments of the power supply control circuit 60 according to the present invention will now be described.

As shown in FIG. 3, the power supply control circuit 60 according to the first embodiment is configured including a p-channel enhancement type MOS-FET 61 connected between the DC power supply 10 and the load circuit 31 so that a body diode D300 formed between the drain and the source is forward biased; a holding circuit 62 for maintaining the ON state of the MOS-FET 61 for a predetermined time when the power supply from the DC power supply 10 is stopped; and a Zener diode ZD1 arranged between the gate and the source of the MOS-FET 61, the anode being connected to the gate and the cathode being connected to the source.

The operations of the MOS-FET 61 and the Zener diode ZD1 will be described in detail below. The Zener voltage of the Zener diode ZD1 is set lower than the voltage of the DC power supply 10. When the DC power supply 10 is connected at the correct polarity, the reverse bias voltage is applied to the Zener diode ZD1 via the body diode D300, whereby the gate voltage of the MOS-FET 61 has a potential lower than the source voltage by the Zener voltage and thus the MOS-FET 61 turned ON.

When the DC power supply 10 is connected at the incorrect polarity, on the other hand, the forward bias voltage is applied to the Zener diode ZD1, whereby the gate voltage and the source voltage of the MOS-FET 61 have substantially the same potential and thus the MOS-FET 61 is turned OFF.

The holding circuit 62 includes a drive circuit 621 for ON operating the MOS-FET 61, a voltage monitoring circuit 622 for detecting the supplied voltage from the DC power supply 10, and a timer circuit 623 for operating the drive circuit 621 over a predetermined time based on the voltage detected by the voltage monitoring circuit 622.

The drive circuit 621 is configured including a step-down circuit 621A for lowering the gate potential of the MOS-FET 61 to lower than the source potential and ON operating the MOS-FET 61, and a step-down circuit operating switch 621B for operating the step-down circuit 621A by the ON/OFF switching control of the timer circuit 623 to be hereinafter described.

The voltage monitoring circuit 622 includes a voltage indicator 622A for detecting the drain voltage of the MOS-FET 61, and a timer circuit operating switch 622B for operating the timer circuit 623 to be hereinafter described after determining that negative surge voltage is being applied to the power supply control circuit 60 when the voltage detected by the voltage indicator 622A is lower than a predetermined value. The predetermined value is set to a voltage value of when the DC power supply 10 is correctly connected.

When the voltage detected by the voltage monitoring circuit 622 is detected as lower than the predetermined voltage, the timer circuit 623 turns ON the step-down circuit operating switch 621B to maintain the ON state of the MOS-FET 61, and turns OFF the step-down circuit operating switch 621B after a predetermined time has elapsed to switch the MOS-FET 61 to the OFF state.

The MOS-FET 61 is maintained in the ON state by the holding circuit 62 and the internal resistance thereof becomes small while the negative surge voltage is being applied, whereby the heat generation of the MOS-FET 61 during the relevant period is suppressed, and breakdown of the MOS-FET 61 is prevented.

Figure 4:
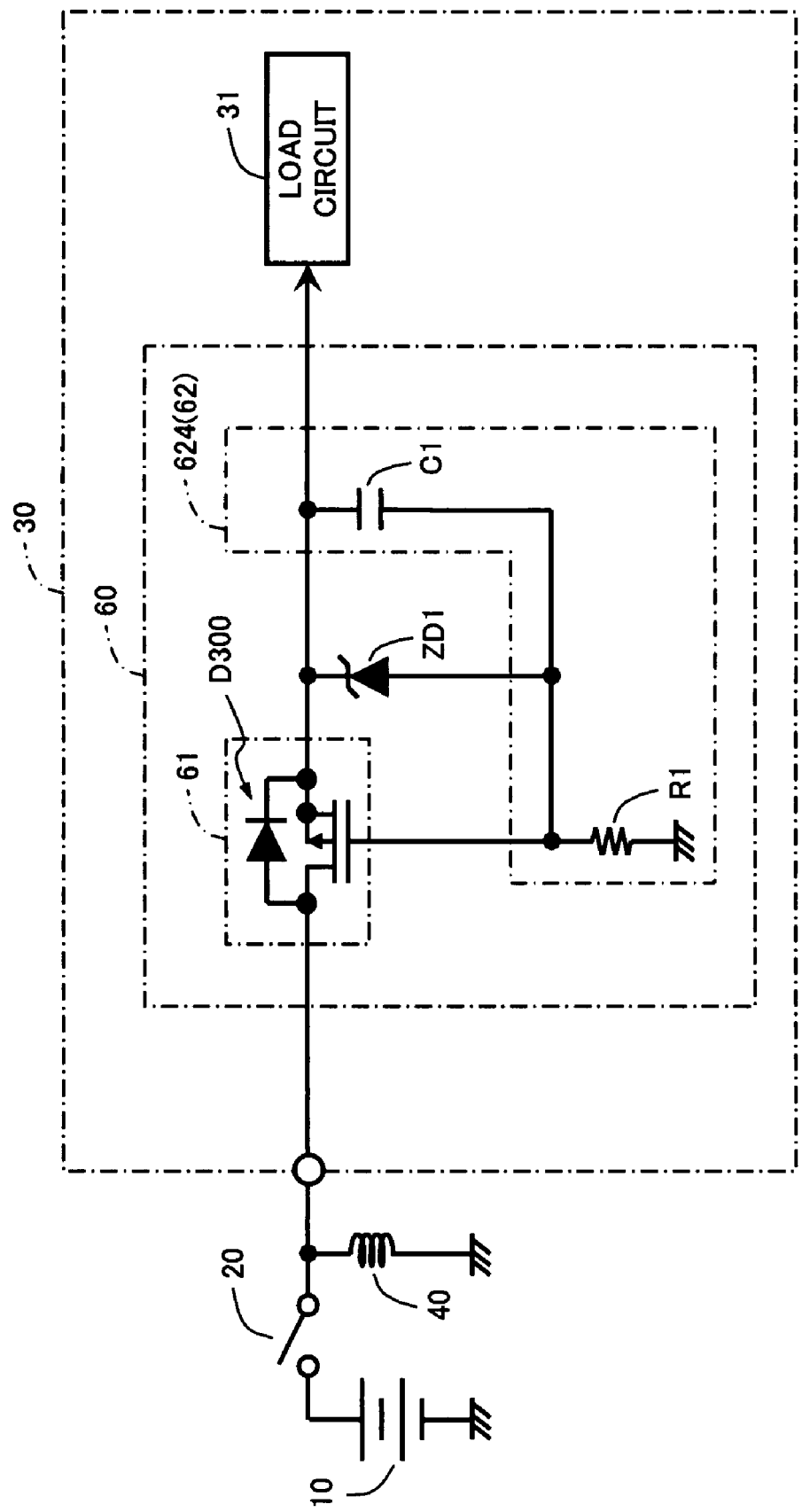
FIG. 4 is a circuit block configuration diagram of the power supply control circuit in which the holding circuit is configured by a CR circuit.

Another example of the holding circuit 62 for maintaining the ON state of the MOS-FET 61 for a predetermined time when the power supply from the DC power supply 10 is stopped includes a CR circuit 624 for turning OFF the MOS-FET 61 after a predetermined time has elapsed, as shown in FIG. 4. The CR circuit 624 is configured by a capacitor C1 connected between the gate and the source of the MOS-FET 61 and a resistor R1 having one end connected to the gate of the MOS-FET 61 and the other end earth grounded, where the ON state of the MOS-FET 61 is maintained over a predetermined time by the charges stored in the capacitor C1 up to the relevant point when the negative surge voltage is applied.

During a predetermined time from when the charges are stored in the capacitor C1 while the DC power supply 10 is in the ON state until when the charges held in the capacitor C1 are discharged when the DC power supply 10 transitions from the ON state to the OFF state, that is, when the power supply is stopped and the field decay surge is generated, the ON state of the MOS-FET 61 is maintained and the current flows between the gate and the source.

The gate voltage of the MOS-FET 61 voltage drops by the divided voltage of the resistor R1 while the charges flow to the capacitor C1 by the voltage involved in back electromotive force by the back electromotive force caused by the field decay surge. Since the back electromotive force is being applied to the source terminal of the MOS-FET 61, the gate voltage of the MOS-FET 61 has a potential lower than the source voltage by the voltage drop in the resistor R1, and the ON state of the MOS-FET 61 is maintained. When all the charges held in the capacitor C1 are discharged after a predetermined time has elapsed, the current no longer flows between the gate and the source of the MOS-FET 61, and thus the gate potential and the source potential of the MOS-FET 61 become the same potential, and the MOS-FET 61 is turned OFF.

The predetermined time can be appropriately adjusted by the capacity of the capacitor C1 and the resistance value of the resistor R1 since it is determined by the time from when the power supply by the DC power supply 10 is stopped until all the charges held in the capacitor C1 are discharged, that is, the time constant obtained by multiplying the capacity of the capacitor C1 and the resistance value of the resistor R1.

The ON state of the MOS-FET 61 can be maintained over a predetermined time by the charges held by the capacitor C1 by using the above-described holding circuit 62 even when the power supply from the DC power supply 10 is stopped and the field decay surge is generated, and thus the heat generation of the MOS-FET 61 is suppressed, and breakdown of the MOS-FET 61 is prevented.

Figure 5:
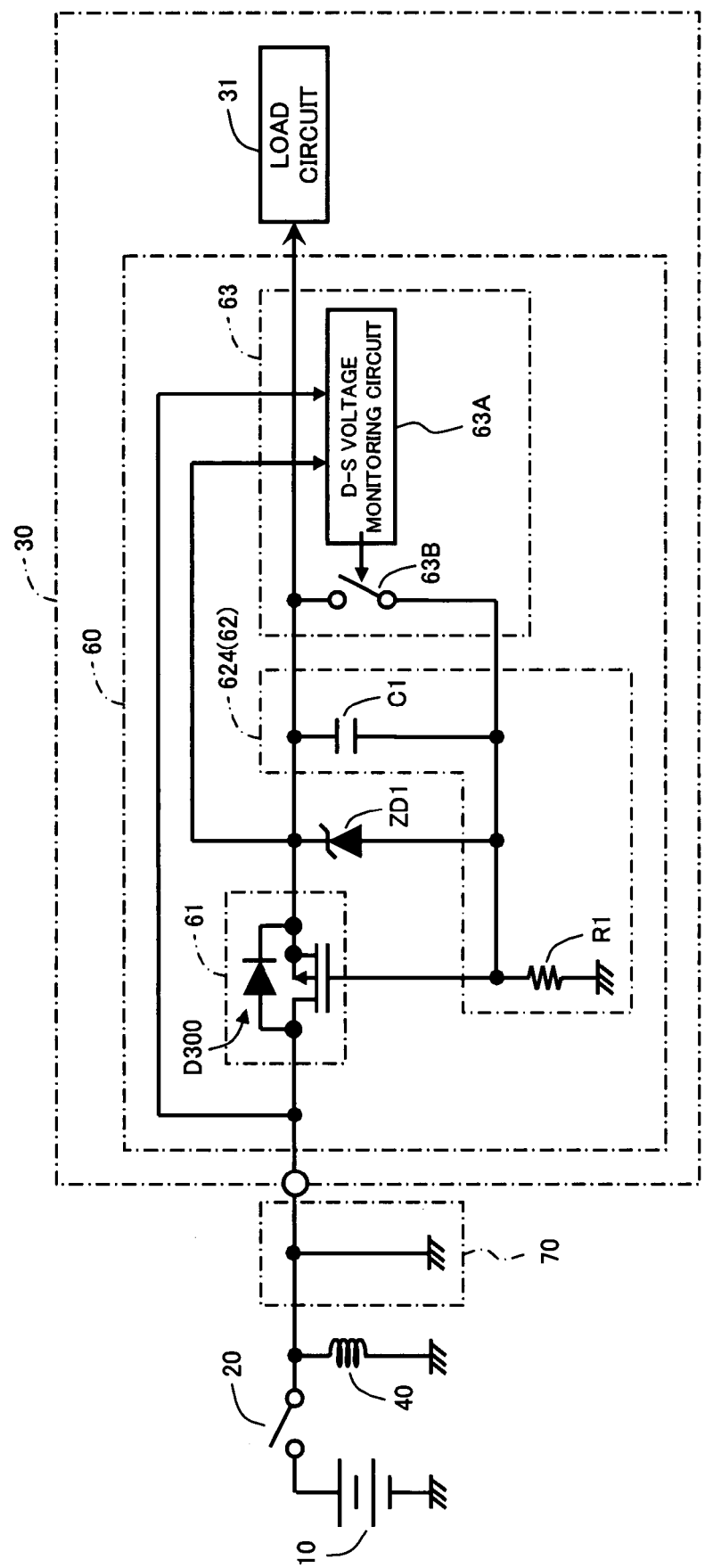
FIG. 5 is a circuit block configuration diagram of the power supply control circuit including a forcing-OFF circuit.

As shown in FIG. 5, the power supply control circuit 60 according to the second embodiment is configured including a forcing-OFF circuit 63 for turning OFF the MOS-FET 61 irrespective of the operation of the CR circuit 624 based on the voltage or the current between the drain and the source of the MOS-FET 61, in addition to the CR circuit 624 shown in the first embodiment.

Various embodiments of the forcing-OFF circuit 63 will now be described.

As shown in FIG. 5, the forcing-OFF circuit 63 is configured including a D-S voltage monitoring circuit 63A for detecting the voltage between the drain and the source of the MOS-FET 61, and a switch 63B for switching ON and OFF based on the drain-source voltage detected by the D-S voltage monitoring circuit 63A by way of example. If the drain-source voltage indicates occurrence of abnormal voltage due to back electromotive force and the like, the switch 63B is turned ON to forcibly turn OFF the MOS-FET 61.

For example, when the field decay surge is generated and the MOS-FET 61 is maintained at the ON state by the charging charges of the capacitor C1, the current from another power supply system might flow into the MOS-FET 61 via the load circuit 31 by a grounding fault (indicated as ground circuit 70 in FIG. 5) in which the DC power supply 10 is grounded for some reason such as fault, and the load circuit 31 may breakdown. In such case, breakdown can be prevented by forcibly turning OFF the MOS-FET 61 by means of the forcing-OFF circuit 63.

The forcing-OFF circuit 63 is preferably set so as to turn OFF the MOS-FET 61 at least when the drain-source voltage or current of the MOS-FET 61 becomes larger than the drain-source voltage or current generated by the field decay surge. More specifically, the forcing-OFF circuit 63 calculates the drain-source voltage generated by the field decay surge in advance from the product of the maximum resistance value when the MOS-FET 61 is in the ON state and the peak current of the field decay surge, and turns OFF the MOS-FET 61 when the drain-source voltage of the MOS-FET 61 becomes larger than the calculated drain-source voltage generated by the field decay surge.

The MOS-FET 61 is forcibly turned OFF only when the grounding fault occurs as described above and the drain-source voltage of the MOS-FET 61 becomes larger than the drain-source voltage of the MOS-FET 61 generated by the field decay surge.

Figure 6:
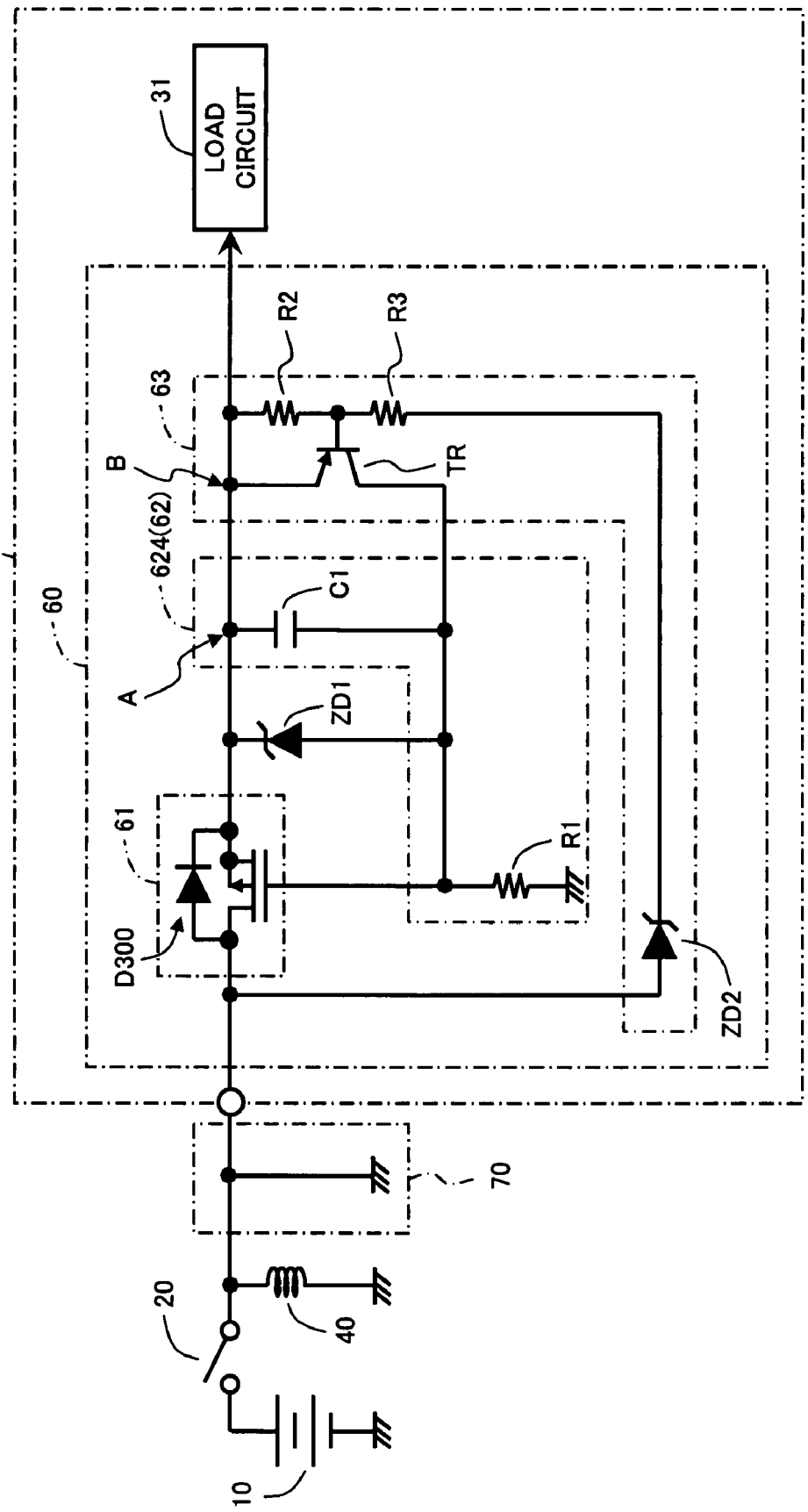
FIG. 6 is a circuit block configuration diagram of the power supply control circuit configured with the forcing-OFF circuit including a switching transistor.

As shown in FIG. 6, for instance, a specific example of the forcing-OFF circuit 63 is configured by a switching transistor TR connected between the gate and the source of the MOS-FET 61, and a bias circuit, in which the resistors R2, R3 and the Zener diode ZD2 are connected in series between the source and the drain of the MOS-FET 61, for applying the voltage at the connecting point of the resistor R2 and the resistor R3 to the base terminal of the switching transistor TR.

The operation of the forcing-OFF circuit 63 described above will now be described. When abnormal voltage larger than the drain-source voltage of the MOS-FET 61 generated by the field decay surge is applied between the drain and the source of the MOS-FET 61, the reverse current flows through the Zener diode ZD2, whereby the switching transistor TR is turned ON, and the MOS-FET 61 is forcibly turned OFF. The Zener voltage is set to a value calculated in advance from the product of the maximum resistance value when the MOS-FET 61 is in the ON state and the peak current of the field decay surge.

Another specific example of the forcing-OFF circuit 63 is configured so as to turn OFF the MOS-FET 61 when the state in which the drain-source voltage or current of the MOS-FET 61 becomes at least larger than the drain-source voltage or current generated by the field decay surge continues for a predetermined time.

Figure 7:
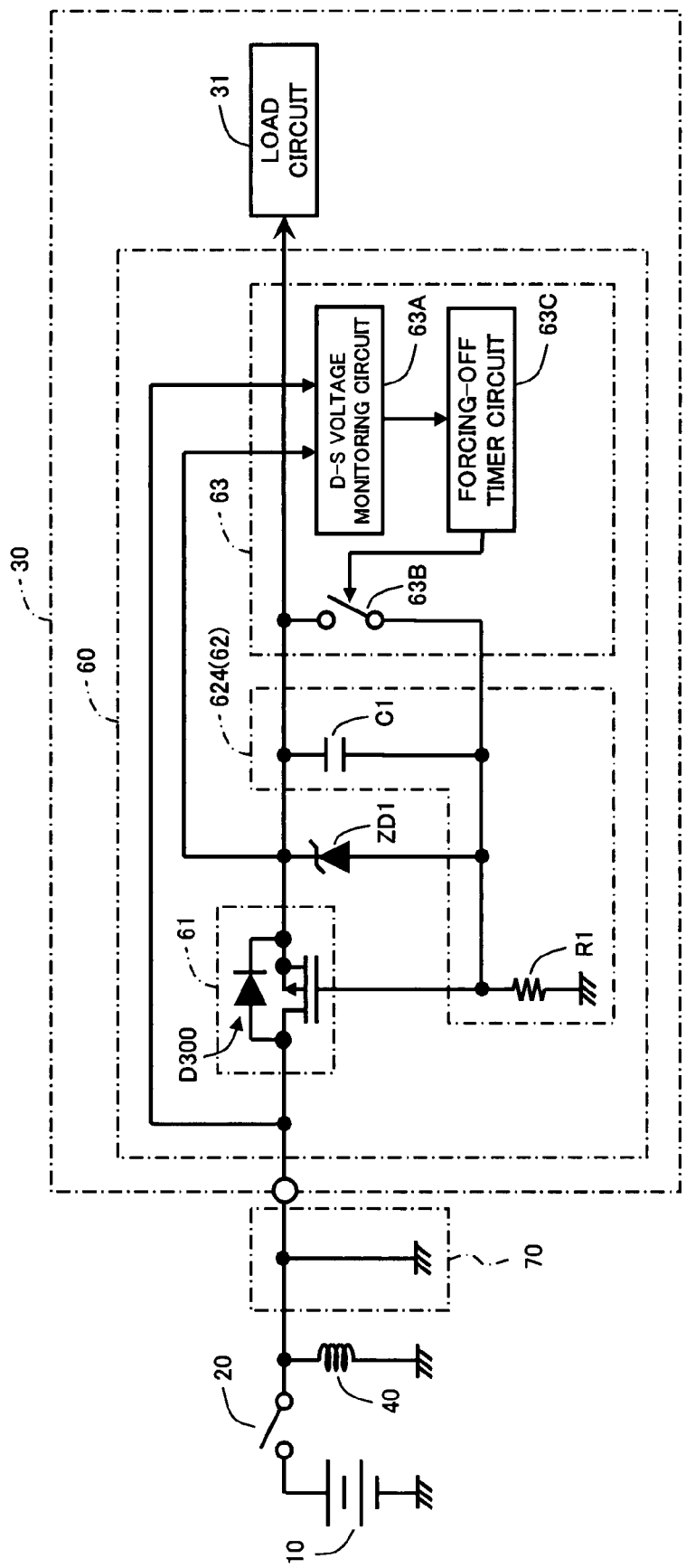
FIG. 7 is a circuit block configuration diagram of the power supply control circuit configured with the forcing-OFF circuit including a forcing-OFF timer circuit.

As shown in FIG. 7, for instance, the forcing-OFF circuit 63 is configured including a forcing-OFF timer circuit 63C in addition to the D-S voltage monitoring circuit 63A for detecting the drain-source voltage of the MOS-FET 61 and the switch 63B for switching ON and OFF based on the drain-source voltage detected by the D-S voltage monitoring circuit 63A described above. The forcing-OFF timer circuit 63C is operated when an abnormal voltage larger than the drain-source voltage generated by the field decay surge due to grounding fault is detected by the D-S voltage monitoring circuit 63A, thereby forcibly turning OFF the MOS-FET 61 by turning ON the switch 63B when the abnormal voltage continues for a predetermined time.

According to the above configuration, the disadvantage in that the MOS-FET 61 is forcibly turned OFF even when the abnormal voltage larger than the negative voltage generated by the field decay surge is only applied for a moment between the drain and the source of the MOS-FET 61 can be avoided. In this case, the threshold voltage for detecting the grounding fault can be set to a smaller value while avoiding breakage of the MOS-FET 61.

The forcing-OFF circuit 63 described above has been described to forcibly turn OFF the MOS-FET 61 by detecting the voltage between the drain and the source of the MOS-FET 61, but may forcibly turn OFF the MOS-FET 61 by detecting the current flowing between the drain and the source of the MOS-FET 61. As shown in FIG. 6, for instance, a resistor may be inserted between point A and point B on the power supply line from the source of the MOS-FET 61 to the load circuit 31 and the current flowing through the resistor may be measured, or the current flowing between the drain and the source of the MOS-FET 61 may be directly measured.

Figure 8:
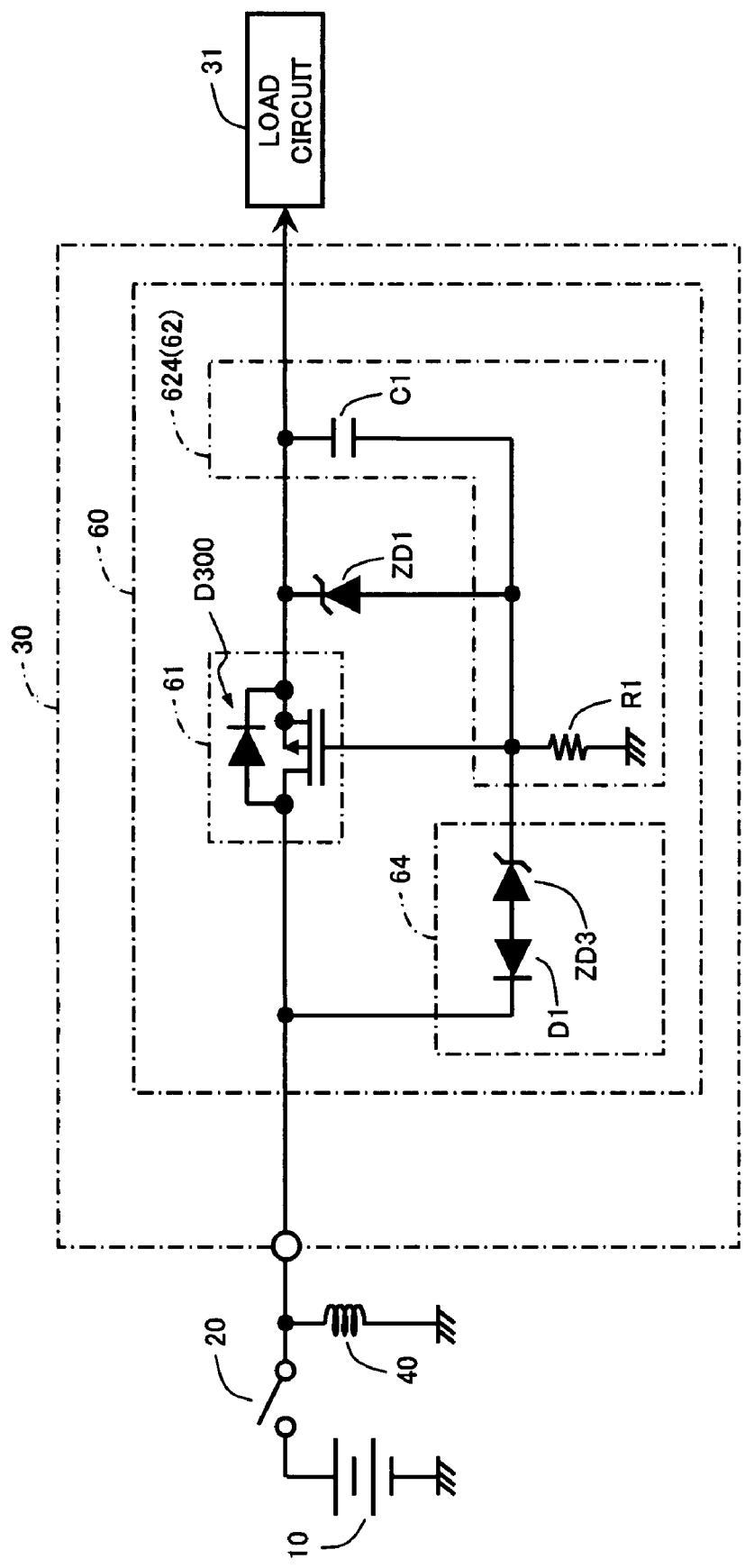
FIG. 8 is a circuit block configuration diagram of the power supply control circuit including an active clamp circuit.

The power supply control circuit 60 according to the third embodiment is configured including an active clamp circuit 64 for ON operating a MOS-FET 61 by the surge voltage generated when the power supply from the DC power supply 10 is stopped. As shown in FIG. 8, the active clamp circuit 64 includes a diode D1 for preventing backflow of the current and a Zener diode ZD3 for determining the operating voltage of the active clamp circuit 64, which are both connected in series between the gate and the drain of the MOS-FET 61. The cathode of the diode D1 is connected to the drain of the MOS-FET 61, the anode of the diode D1 is connected to the anode of the Zener diode ZD3, and the cathode of the Zener diode ZD3 is connected to the gate of the MOS-FET 61.

The operation of the active clamp circuit 64 described above will be described in detail below. When the negative surge voltage is applied to the power supply control circuit 60, if the negative surge voltage is smaller than the Zener voltage of the Zener diode ZD3, the current does not flow to the active clamp circuit 64, and thus the gate voltage and the source voltage of the MOS-FET 61 have the same potential and the MOS-FET 61 is turned OFF, whereas if the negative surge voltage is larger than the Zener voltage of the Zener diode ZD3, the current flows to the active clamp circuit 64, and thus the gate voltage of the MOS-FET 61 becomes lower than the source voltage of the MOS-FET 61 by the voltage drop in the resistor R1 and the MOS-FET 61 is turned ON.

The heat generation of the switching element of the power supply control circuit 60 can be suppressed and the breakdown of the switching element can be prevented by using the configuration described above even if the surge voltage other than the field decay surge such as the surge voltage resulting from ESD (electrostatic discharge) and the surge voltage flowing from another power supply system is generated.

Figure 9:
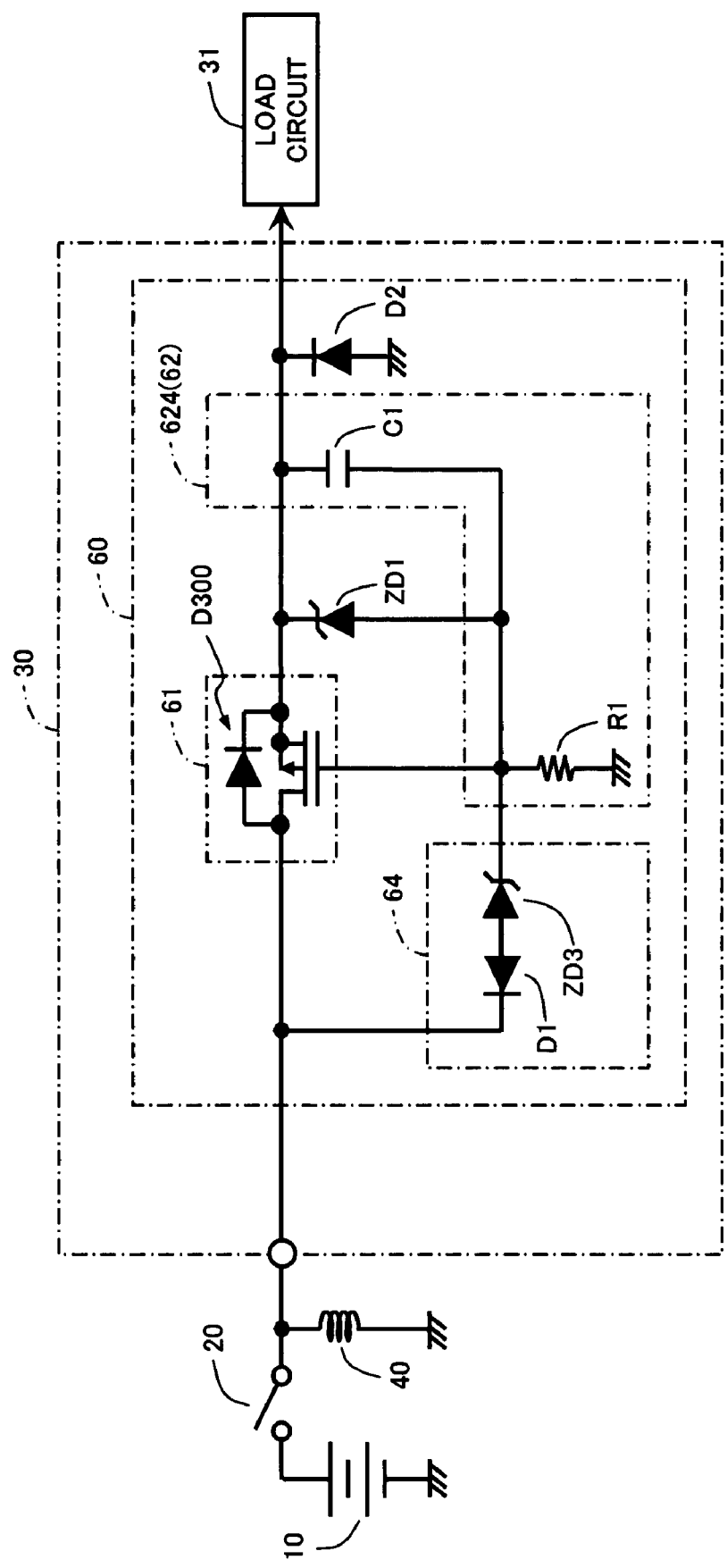
FIG. 9 is a circuit block configuration diagram of the power supply control circuit including a diode for by-passing the surge current.

The power supply control circuit 60 according to the fourth embodiment is configured by further including at the post-stage of the MOS-FET 61 a diode D2 for by-passing the surge current generated when the power supply from the DC power supply 10 is stopped. As shown in FIG. 9, the cathode of the diode D2, which anode is earth grounded, is connected to the source of the MOS-FET 61, that is, the diode D2 is connected in parallel at the post-stage of the MOS-FET 61. If the negative surge current is generated, the reverse current flows in a direction from the load circuit 31 towards the DC power supply 10, but a large portion of the reverse current flows through the diode D2 instead of through the load circuit 31 by connecting the diode D2.

The element of the load circuit 31 may breakdown if the reverse current flows through the load circuit 31, but the flow of large amount of current to the load circuit 31 can be inhibited and the breakdown of the load circuit 31 can be prevented with the configuration described above.

Figure 10:
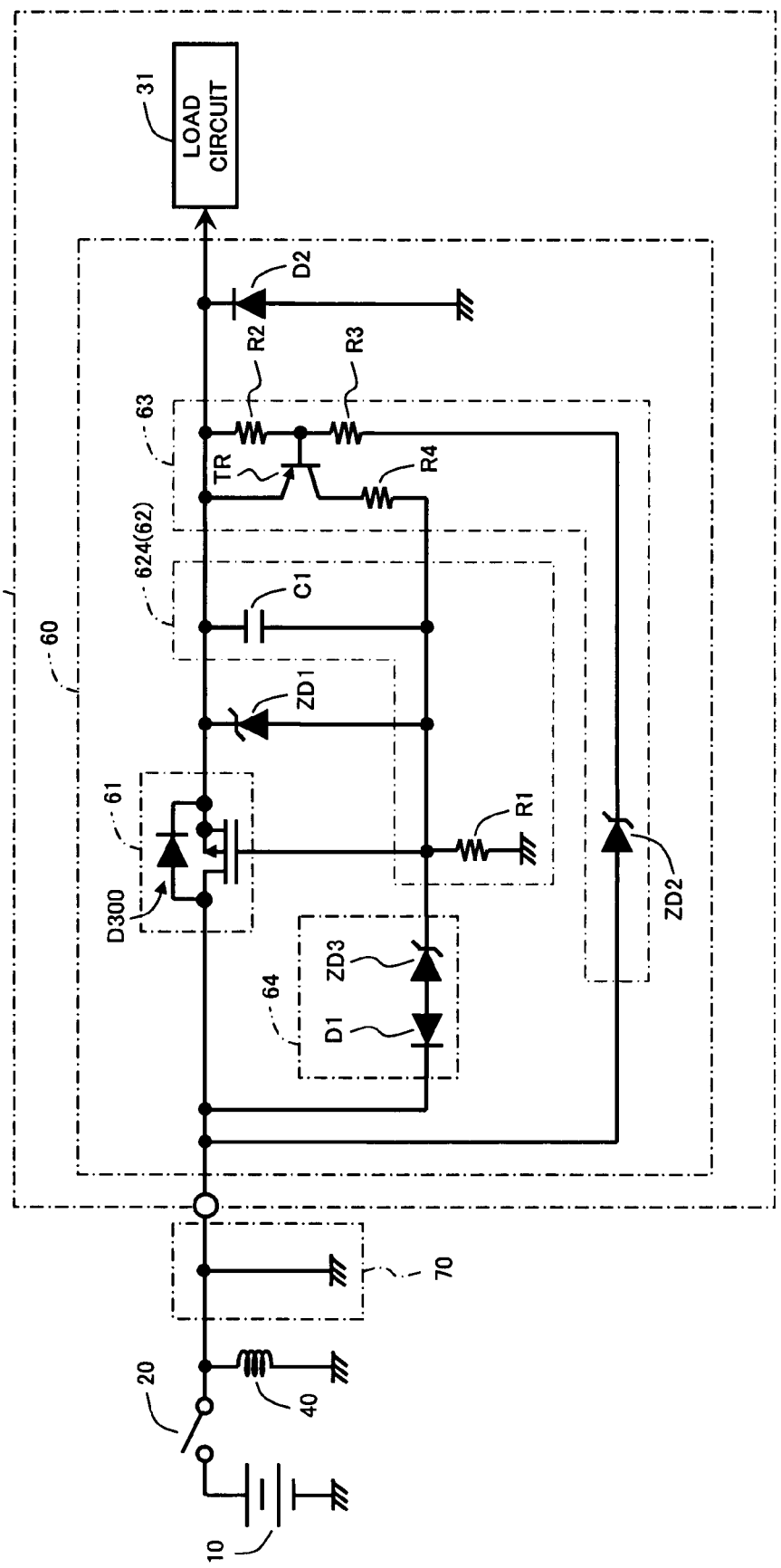
FIG. 10 is a circuit block configuration diagram of the power supply control circuit using both the forcing-OFF circuit and the active clamp circuit.

The power supply control circuit 60 according to the fifth embodiment is configured including the holding circuit 62 configured by the capacitor C1 connected between the gate and the source of the MOS-FET 61 and the resistor R1 for discharging the charges stored in the capacitor C1; the active clamp circuit 64 configured by the Zener diode ZD3 and the backflow preventing diode D1 connected between the gate and the drain of the MOS-FET 61; the forcing-OFF circuit 63 including the switching transistor TR for short circuiting the gate and the source of the MOS-FET 61 based on the drain-source voltage etc.; and a resistor R4 is further connected between the switching transistor TR and the gate of the MOS-FET 61, as shown in FIG. 10.

The ON state of the MOS-FET 61 is maintained over a predetermined time by the charges stored in the capacitor C1 when the field decay surge is generated, but if the current flows from another power supply system due to grounding fault and the like occurs at the relevant time, the MOS-FET 61 is forcibly turned OFF by the switching transistor TR irrespective of the discharging state of the capacitor C1 if the resistor R4 is not arranged, and thus the active clamp circuit does not operate.

The resistor R4 for having the gate voltage of the MOS-FET 61 lower than the source voltage is thus arranged to operate the active clamp circuit even when the switching transistor TR is turned ON.

That is, the function of preventing breakdown of the load circuit 31 by the grounding fault and the surge absorption function by the active clamp circuit are both satisfied by arranging the resistor R4.

Figure 11:
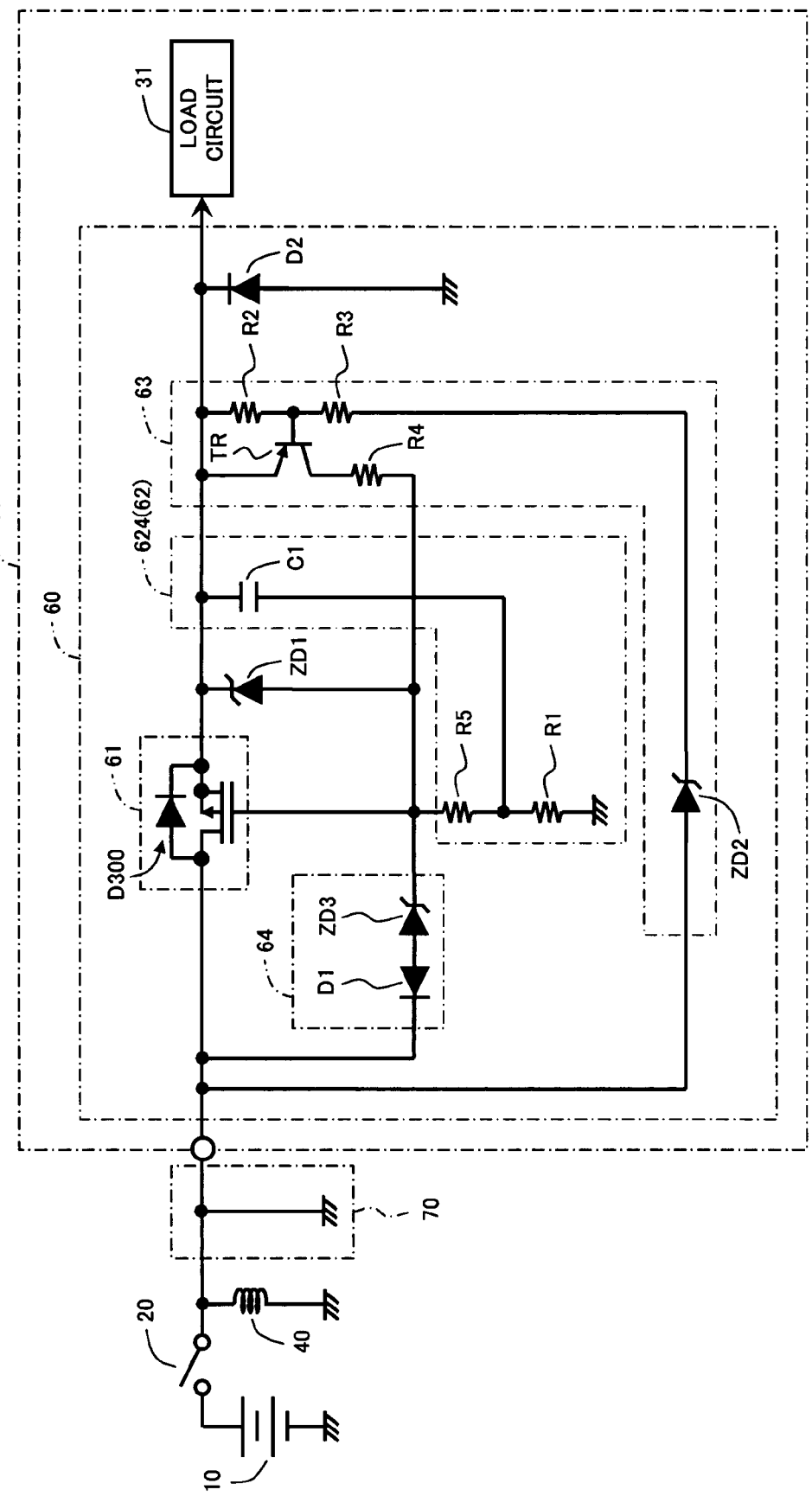
FIG. 11 is a circuit block configuration diagram of the power supply control circuit including a resistor for rapidly discharging the capacitor.

The power supply control circuit 60 according to the sixth embodiment is configured further including a resistor R5 between the capacitor C1 and the gate of the MOS-FET 61, as shown in FIG. 11.

In the case of a circuit (see e.g., FIG. 4) not arranged with the resistor R5, the capacitor C1 is discharged only through the path of the resistor R1 when the power supply from the DC power supply 10 is stopped, but the time until the MOS-FET 61 is turned OFF becomes long if the time constant is set large.

If the resistor R5 is arranged, however, the charges of the capacitor C1 are discharged through the path of the resistor R1 and through the path of the resistor R4 and the resistor R5 formed by the switching transistor TR that is turned ON when the power supply from the DC power supply 10 is stopped, and thus the discharging time of the charges of the capacitor C1 reduces and the time until the MOS-FET 61 is turned OFF reduces.

Figure 12:
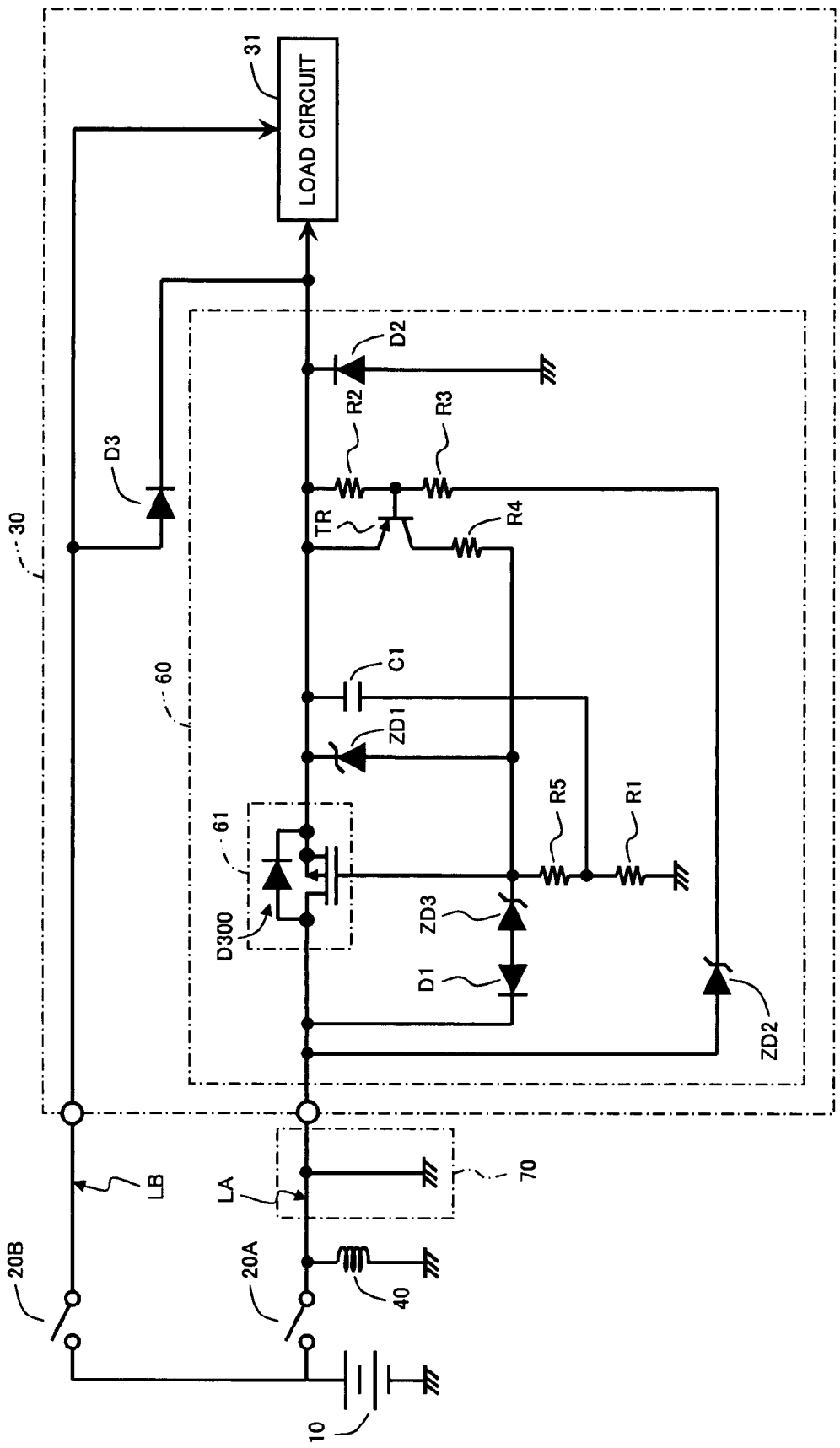
FIG. 12 is a circuit block configuration diagram of a supplying circuit including two systems of power supply lines, where one power supply line and the other power supply line are connected with a diode.

Another embodiment will be described below. The power supplying circuit arranged with one system of power supply line for supplying power from the DC power supply 10 to the load circuit 31 has been described in the above embodiment, but the power supplying circuit in which a plurality of power supply lines LA, LB for supplying power from the DC power supply 10 to the load circuit 31 are arranged may be configured, where the power supply control circuit 60 performed with grounding measures is arranged on at least one specific power supply line LA and the diode D3 is connected at the post-stage of the power supply control circuit 60 from the other power supply line LB so as to be forward biased, as shown in FIG. 12.

In this case, when the grounding fault in which the specific power supply line LA is grounded for some reason (indicated as a grounding circuit 70 in FIG. 12) occurs, the power is supplied from the other power supply line LB to the load circuit 31 via the diode D3, and thus the fail safe function for preventing the operation of the load circuit 31 from stopping is exhibited. The back current flows to the power supply line LA at where the grounding fault occurred, but the breakdown of the incorporated MOS-FET 61 is prevented since the power supply control circuit 60 is operated.

An expensive power supply control circuit 60 does not need to be arranged on all the power supply lines LA, LB by using the power supplying circuit described above, and a multiplex system of the power supply of high reliability is configured by simply arranging the inexpensive diode D3 between one power supply LB and the other power supply line LA arranged with the power supply control circuit 60.

Figure 13:
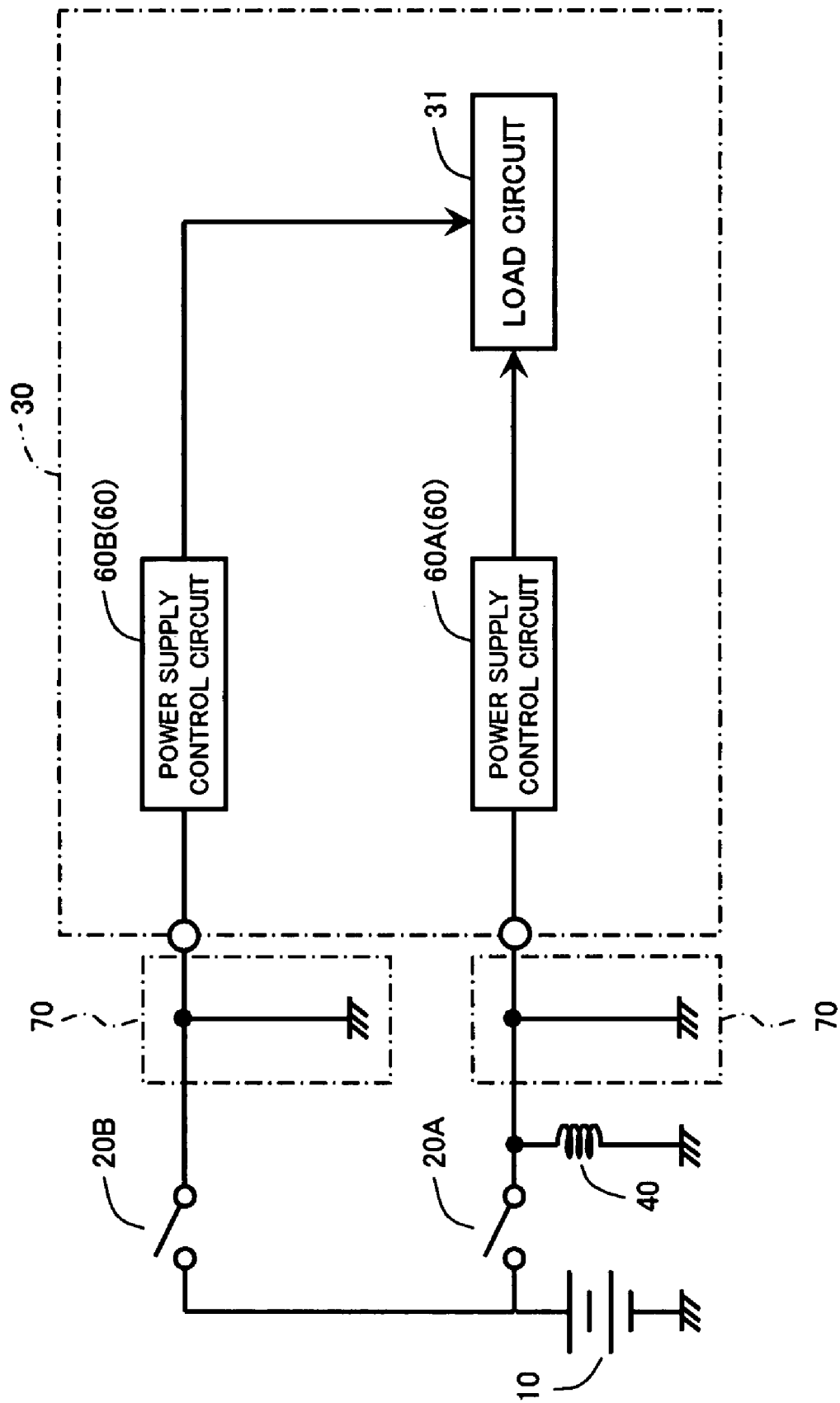
FIG. 13 is a circuit block configuration diagram of the supplying circuit including two systems of power supply lines, where the power supply control circuit is arranged on each of the power supply line.

Furthermore, as shown in FIG. 13, the power supplying circuit can be configured with the power supply control circuit 60 (60A and 60B) performed with the grounding measures described above arranged on each of the plurality of power supply lines for supplying power from the DC power supply 10 to the load circuit 31.

In this case, even if the grounding fault in which one of the power supply lines is grounded (indicated as the grounding circuit 70 in FIG. 13) for some reason by faults etc. occurs, the power is supplied from the power supply line, at where the grounding fault has not occurred, to the load circuit 31, thereby preventing the operation of the load circuit 31 from stopping. Furthermore, the power supply control circuit 60 (60A or 60B) is operated if back current flows to one of the power supply lines, thereby preventing the breakdown of the load circuit 31 or the MOS-FET 61.

If the diode cannot be used in connecting the plurality of power supply lines such as when the minimum operating voltage of the circuit is high, when the electronic control device 30 is configured by a circuit that is weak to heat generation, or the like, the multiplex system of the power supply can be configured by adopting the configuration described above.

The power supplying circuit shown in FIGS. 12 and 13 supplies power from the plurality of power supply lines to a common load circuit 31, but a different load circuit other than the load circuit 31 common to each power supply line may be additionally connected.

The power supply control circuit 60 may be manufactured using discrete elements such as a resistor and a capacitor, but may be configured by a power supply control integrated circuit such as intelligent power device (IPD) manufactured through a semiconductor manufacturing process, where the power supply control circuit 60 can be miniaturized in the latter case.

The multiplex system of the power supply is a preferred application example of the present invention since the vehicle or the electronic control device mounted on the vehicle is not subjected to critical operation even if abnormality occurs at the power supply terminal, that is, fail safe property is particularly demanded.

The configuration in which the power supply control circuit 60 is arranged in each electronic control device 30 has been described in the embodiments described above, but one power supply control circuit 60 may be arranged on a common power supply line, to which the plurality of electronic control devices 30 are connected, without arranging the power supply control circuit 60 in the each electronic control device 30.

For example, a configuration in which one power supply control circuit 60 is arranged on each of the power supply line L1A between the ignition switch 20 and the IG ON ECU 30A and the power supply line L1B between the power supply and the always-ON ECU 30B, or a configuration in which one power supply control circuit 60 is arranged on the power supply line L1 between the pre-stage of the branching point L1AB of the two systems of power supply lines L1A, L1B and the DC power supply 10, may be adopted, as shown in FIG. 2.

The MOS-FET 61 is configured by p-channel in the above described embodiment, but the MOS-FET 61 may be configured by n-channel. The step-down circuit 621A for having the gate potential of the MOS-FET 61 lower than the source potential is arranged to have the MOS-FET 61 in the ON state when using the p-channel MOS-FET 61, as shown in FIG. 3, but a step-up circuit for having the gate potential of the MOS-FET 61 higher than the source potential may be arranged in place of the step-down circuit 621A to have the MOS-FET 61 in the ON state when using the n-channel MOS-FET 61.

Furthermore, the circuit configuration using the enhancement type MOS-FET 61 has been described in the above embodiment, but the circuit may be configured using a depression type MOS-FET 61.

According to the present invention, the power supply control circuit that prevents breakdown of the internal circuit on the load side even when the polarity of the DC power supply is reverse connected by mistake, and suppresses heat generation of the switching element caused by the surge voltage when the surge voltage is generated, thereby preventing breakdown of the switching element; the electronic control device equipped with the power supply control circuit; and the power supplying circuit equipped with the power supply control circuit are realized, as described above.

The plurality of embodiments described above are merely examples of the present invention, and the configurations described in each embodiment may be appropriately combined within the scope of obtaining the effects of the present invention, and the specific circuit configuration of each block can be appropriately design changed within the scope of obtaining the effects of the present invention.

What is claimed is:

1. A power supply control circuit comprising:
   a MOS-FET including a gate and a source and being connected between a DC power supply and a load circuit so that a body diode formed between the drain and the source is forward biased by the DC power supply during normal operation;
   a holding circuit configured including a capacitor connected between the gate and the source of the MOS-FET and a resistor for discharging the charges stored in the capacitor, the holding circuit for maintaining the ON state of the MOS-FET for a predetermined time when the power supply from the DC power supply is stopped; and
   a forcing-OFF circuit configured including a switching transistor connected between the gate and the source of the MOS-FET and a bias circuit for controlling the switching transistor, the bias circuit including a Zener diode forward biased by the DC power supply during normal operation and resistors connected in series between the drain and the source of the MOS-FET, the forcing-OFF circuit for turning ON the switching transistor when a drain-source voltage of the MOS-FET becomes larger than a drain-source voltage generated by a field decay surge and turning OFF the MOS-FET irrespective of the operation of the holding circuit, wherein a reverse voltage of the Zener diode is set to a value calculated from the product of a maximum resistance value when the MOS-FET is in the ON state and a peak current of the field decay surge.

2. The power supply control circuit according to claim 1, wherein
   the forcing-OFF circuit includes a forcing-OFF timer circuit for turning ON the switching transistor at least when a state in which the drain-source voltage becomes larger than a drain-source voltage generated by a field decay surge continues for a predetermined time.

3. A power supplying circuit comprising:
   a plurality of power supply lines for supplying power from a DC power supply to a load circuit;
   the power supply control circuit according to claim 2 arranged on at least one specific power supply line; and
   a diode connected in forward direction at the post-stage side from a connecting position of the power supply control circuit of the specific power supply line from another power supply line.

4. A power supplying circuit comprising:
   a plurality of power supply lines for supplying power from a DC power supply to a load circuit; and
   the power supply control circuit according to claim 2 arranged on the each power supply line.

5. The power supply control circuit according to claim 1, further comprising:
   an active clamp circuit for ON operating the MOS-FET by a surge voltage generated when the power supply from the DC power supply is stopped.

6. A power supplying circuit comprising:
   a plurality of power supply lines for supplying power from a DC power supply to a load circuit;
   the power supply control circuit according to claim 5 arranged on at least one specific power supply line; and
   a diode connected in forward direction at the post-stage side from a connecting position of the power supply control circuit of the specific power supply line from another power supply line.

7. A power supplying circuit comprising:
   a plurality of power supply lines for supplying power from a DC power supply to a load circuit; and
   the power supply control circuit according to claim 5 arranged on the each power supply line.

8. The power supply control circuit according to claim 1, further comprising:
   a diode connected in parallel at the post-stage of the MOS-FET for by-passing a surge current generated when the power supply from the DC power supply is stopped.

9. The power supply control circuit according to claim 8, further comprising:
   an active clamp circuit for ON operating the MOS-FET by a surge voltage generated when the power supply from the DC power supply is stopped.

10. A power supplying circuit comprising:
    a plurality of power supply lines for supplying power from a DC power supply to a load circuit;
    the power supply control circuit according to claim 8 arranged on at least one specific power supply line; and
    a diode connected in forward direction at the post-stage side from a connecting position of the power supply control circuit of the specific power supply line from another power supply line.

11. A power supplying circuit comprising:
    a plurality of power supply lines for supplying power from a DC power supply to a load circuit; and the power supply control circuit according to claim 8 arranged on the each power supply line.

12. A power supplying circuit comprising:

a plurality of power supply lines for supplying power from a DC power supply to a load circuit;

the power supply control circuit according to claim 1 arranged on at least one specific power supply line; and a diode connected in forward direction at the post-stage side from a connecting position of the power supply control circuit of the specific power supply line from another power supply line.

13. A power supplying circuit comprising:

a plurality of power supply lines for supplying power from a DC power supply to a load circuit; and the power supply control circuit according to claim 1 arranged on the each power supply line.

14. A power supply control integrated circuit configured by integrating the power supply control circuit according to claim 1 through a semiconductor manufacturing process.

15. An electronic control device comprising:

a load circuit, which is an electronic control block including a CPU and peripheral circuits; and the power supply control circuit according to claim 1.

16. A power supply control circuit comprising:

a MOS-FET including a gate and a source and being connected between a DC power supply and a load circuit so that a body diode formed between the drain and the source is forward biased by the DC power supply during normal operation;

a holding circuit configured including a capacitor connected between the gate and the source of the MOS-FET and a first resistor for discharging the charges stored in the capacitor, the holding circuit for maintaining the ON state of the MOS-FET for a predetermined time when the power supply from the DC power supply is stopped;

a forcing-OFF circuit configured including a switching transistor connected between the gate and the source of the MOS-FET and a bias circuit for controlling the switching transistor, the bias circuit including a Zener diode forward biased by the DC power supply during normal operation and resistors connected in series between the drain and the source of the MOS-FET, the forcing-OFF circuit for turning ON the switching transistor by a reverse current flowing through the Zener diode when a drain-source voltage of the MOS-FET becomes larger than a drain-source voltage generated by a field decay surge and turning OFF the MOS-FET irrespective of the operation of the holding circuit; and an active clamp circuit having a Zener diode and a backflow preventing diode connected in series between the gate and the drain of the MOS-FET, wherein the forcing-OFF circuit includes a second resistor connected between the gate of the MOS-FET and the switching transistor for operating the active clamp circuit when the switching transistor is turned ON.

17. The power supply control circuit according to claim 16, wherein the holding circuit includes a third resistor connected between a node connecting the capacitor and the first resistor and the gate of the MOS-FET for reducing the discharging time of the charge of the capacitor.

18. A power supply control integrated circuit configured by integrating the power supply control circuit according to claim 16 through a semiconductor manufacturing process.

19. An electronic control device comprising:

a load circuit, which is an electronic control block including a CPU and peripheral circuits; and the power supply control circuit according to claim 16.

* * * * *